(12) United States Patent
Ding

(10) Patent No.: US 9,127,361 B2
(45) Date of Patent: Sep. 8, 2015

(54) METHODS OF AND APPARATUS FOR CONTROLLING PRESSURE IN MULTIPLE ZONES OF A PROCESS TOOL

(75) Inventor: Junhua Ding, Tewksbury, MA (US)

(73) Assignee: MKS Instruments, Inc., Andover, MA (US)

( * ) Notice: Subject to any disclaimer, the term of this patent is extended or adjusted under 35 U.S.C. 154(b) by 1018 days.

(21) Appl. No.: 12/632,514

(22) Filed: Dec. 7, 2009

(65) Prior Publication Data
US 2011/0135821 A1    Jun. 9, 2011

(51) Int. Cl.
  G05D 16/02    (2006.01)
  C23C 16/455   (2006.01)
  C23C 16/52    (2006.01)
  G05D 16/20    (2006.01)

(52) U.S. Cl.
  CPC ..... C23C 16/45557 (2013.01); C23C 16/45561 (2013.01); C23C 16/52 (2013.01); G05D 16/02 (2013.01); G05D 16/206 (2013.01)

(58) Field of Classification Search
  CPC .......... G05D 16/02; G05D 16/206; C23C 16/45557; C23C 16/45561; C23C 16/52
  USPC ............................. 137/883, 487.5; 73/861.03
  See application file for complete search history.

(56) References Cited

U.S. PATENT DOCUMENTS

| | | | |
|---|---|---|---|
| 5,441,076 A * | 8/1995 | Moriya et al. | 137/486 |
| 5,453,124 A | 9/1995 | Moslehi et al. | |
| 5,968,588 A | 10/1999 | Sivaramakrishnan et al. | |
| 6,022,483 A * | 2/2000 | Aral | 216/59 |
| 6,482,649 B1 | 11/2002 | Gogol et al. | |
| 6,532,978 B1 * | 3/2003 | Muller-Kuhrt et al. | 137/1 |
| 6,752,166 B2 * | 6/2004 | Lull et al. | 137/9 |
| 6,820,632 B2 * | 11/2004 | Ohmi et al. | 137/14 |
| 6,986,359 B2 * | 1/2006 | Shajii et al. | 137/14 |
| 7,007,707 B2 * | 3/2006 | Ambrosina et al. | 137/9 |
| 7,055,550 B2 * | 6/2006 | Harris et al. | 137/884 |
| 7,204,155 B2 * | 4/2007 | Lane et al. | 73/861 |

(Continued)

FOREIGN PATENT DOCUMENTS

| | | |
|---|---|---|
| JP | 2007-528603 | 10/2007 |
| JP | 2009-524147 | 6/2009 |

(Continued)

OTHER PUBLICATIONS

PCT International Search Report and Written Opinion for related PCT Application No. PCT/US2010/058156, 10 pages.

(Continued)

*Primary Examiner* — William McCalister
(74) *Attorney, Agent, or Firm* — McDermott Will & Emery LLP

(57) ABSTRACT

A method of and a multiple zone pressure controller system for controlling the pressure of a gas or vapor flowing to at least two zones of a process tool such as a vacuum deposition chamber. The system comprises: at least two channels configured and arranged so as to provide the flow of the gas or vapor to corresponding zones of the process tool, each channel including a pressure controller configured and arranged to control the pressure of gas or vapor in each channel, a leakby orifice or nozzle configured to provide a leak rate of gas or vapor from the channel; and a controller configured and arrange to determine the true flow information to each zone of the process tool so that the true leak rate in the chamber can be determined.

9 Claims, 3 Drawing Sheets

(56) References Cited

U.S. PATENT DOCUMENTS

| | | |
|---|---|---|
| 7,353,841 B2 * | 4/2008 | Kono et al. ............ 137/487.5 |
| 2004/0050326 A1 | 3/2004 | Thilderkvist et al. |
| 2006/0237063 A1 | 10/2006 | Ding et al. |
| 2007/0177985 A1 * | 8/2007 | Walls et al. ............ 417/44.2 |
| 2008/0000530 A1 | 1/2008 | Sun et al. |

FOREIGN PATENT DOCUMENTS

| | | |
|---|---|---|
| KR | 20070011342 | 1/2007 |
| KR | 20080083712 | 9/2008 |
| KR | 20080083713 | 9/2008 |
| KR | 20080083713 A1 | 9/2008 |
| WO | WO 2004/055855 A2 | 7/2004 |
| WO | 2005/094404 | 10/2005 |
| WO | 2007/123576 | 11/2007 |
| WO | 2007123576 A1 | 11/2007 |

OTHER PUBLICATIONS

Office Action dated Dec. 19, 2013 from Corresponding Korean Patent Application No. 2012-7017188.

Office Action dated Nov. 13, 2014 from rre pondin German Application No. 112010004710.3.

Office Action dated Apr. 10, 2015 from corresponding Korean Application No. 10-2014-7032950.

\* cited by examiner

METHODS OF AND APPARATUS FOR CONTROLLING PRESSURE IN MULTIPLE ZONES OF A PROCESS TOOL

FIELD OF THE DISCLOSURE

The disclosure is directed to multiple zone pressure controllers, and more particularly to an improved method of and apparatus for controlling pressure in multiple zones of a process tool such as a vacuum deposition chamber.

BACKGROUND OF THE DISCLOSURE

With manufactured semiconductor wafers increasing in size, systems for delivering gases and vapors to process tools, such as vacuum deposition chambers, are required to simultaneously introduce a gas or vapor used in the deposition process into more than one zone of the process tool to insure uniform deposition and high quality processing of each wafer. Maintaining the pressure of the input flow into each zone at the desired pressure is necessary to achieve the desired results. Thus, dual zone pressure controllers are known for providing a flow of a gas or vapor through separately controlled channels into two zones of a process chamber at a controlled pressure. With bigger wafer sizes becoming even more desirable, multiple zone pressure controllers for controlling the pressure of gas or vapors must be designed to provide gas and vapors to more than two zones of a process chamber at a controlled pressure. However, with an increase in the number of zones, there is a need to reduce the costs of manufacturing of the multiple zone pressure controllers as the need for control of more zones becomes necessary. Further effort must also be made to reduce the physical space limitations posed by these controllers.

In implementation, the wafer is positioned on a wafer support and held in place by a vacuum. With larger wafers, the wafer may not form a complete seal around the contact areas between the wafer and the wafer support. As a result there may be some leakage of at one or more of these contact areas, making it difficult to control the pressure of the gas introduced into each of the zones. Currently, a needle valve (called a "leakby" valve) is employed for partially diverting some of the flow of each channel from the inlet flow into a corresponding zone so that the inlet flow pressure of the gas or vapor into each zone can be adjusted so as to maintain the desired pressure of the inlet flow to each zone despite leakage at the contact areas between the wafer support and the wafer.

Thus, leakby needle valves can be used to tweak each channel so as to ensure that the inlet flow to each zone are match from channel to channel for a given same pressure setpoint. This way the flow rates into the various zones of a chamber can be equalized by tweaking the various needle valves. Needle valves, however, are expensive and physically take up space usually in a confined manufacturing area.

SUMMARY

Aspects and embodiments of the present disclosure address the shortcomings noted previously by a method of and a multiple zone pressure controller system for controlling the pressure of a gas or vapor flowing to at least two zones of a process tool such as a vacuum deposition chamber. The system comprises: at least two channels configured and arranged so as to provide the flow of the gas or vapor to corresponding zones of the process tool, each channel including a pressure controller configured and arranged to control the pressure of gas or vapor in each channel, a leakby orifice or nozzle configured to provide a leak rate of gas or vapor from the channel; and a controller configured and arrange to determine the true flow information to each zone of the process tool so that the true leak rate in the chamber can be determined.

Other features and advantages of the present disclosure will be understood upon reading and understanding the detailed description of exemplary embodiments, described herein, in conjunction with reference to the drawings.

GENERAL DESCRIPTION OF THE DRAWINGS

Aspects of the present disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings.

Figure 1:
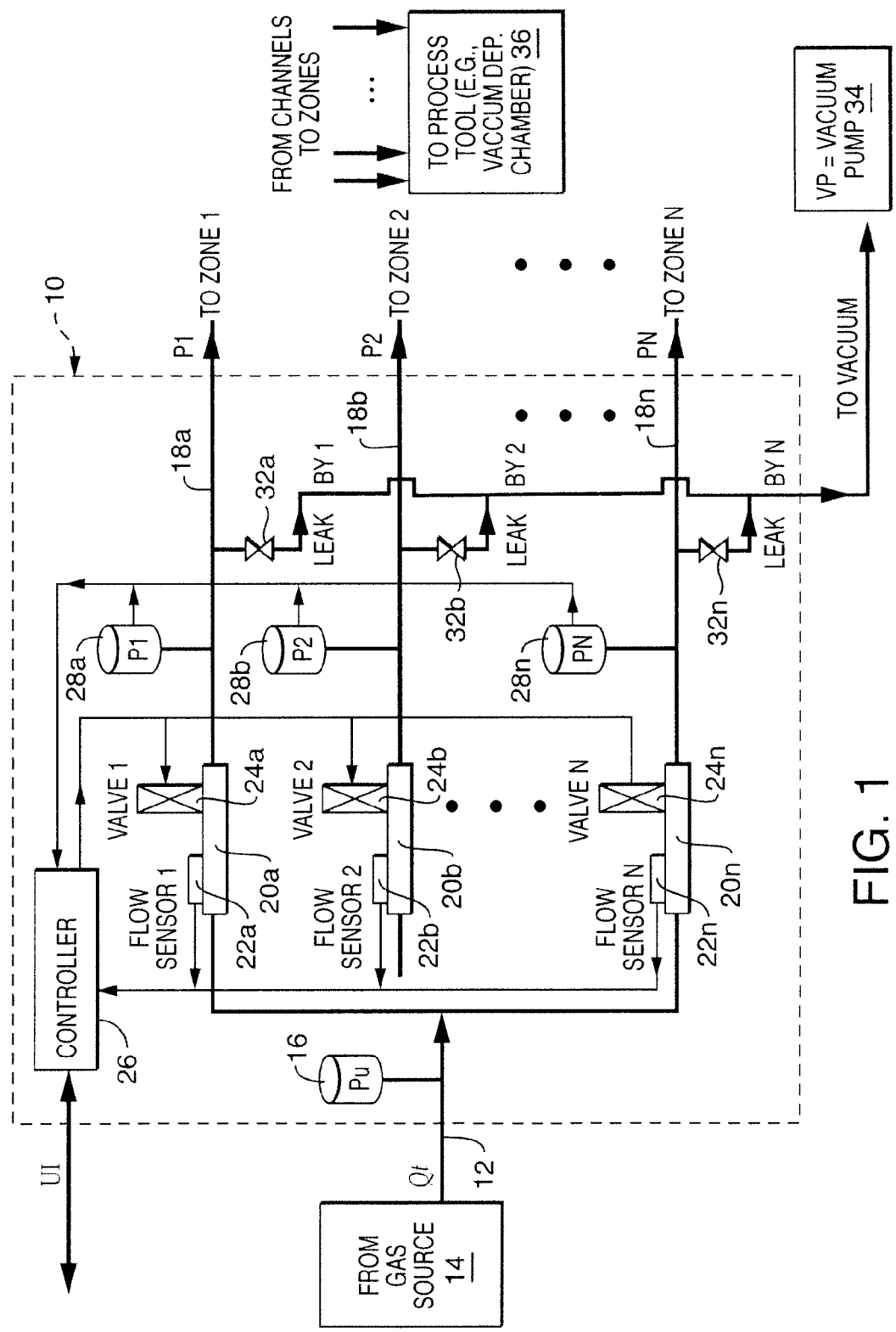
FIG. 1 is a partial schematic, partial block diagram of one embodiment of a multiple zone controller for controlling the pressure of inlet flow of a gas or vapor into multiple zones of a vacuum deposition chamber.

While certain embodiments are depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION OF THE DRAWINGS

As described previously, embodiments of the present disclosure are directed to a system for and method of providing an improved solution for multiple zone pressure control. The system and method provide improved pressure control performance in response to upstream pressure disturbances. Specifically, the system is configured and arranged and the method is performed so as to provide true flow information to multiple zones of a process tool such as a vacuum deposition chamber, while reducing the material and manufacturing and performance costs of that of the dual zone pressure controller described above.

In particular, the system is arranged so that each needle valve is replaced by an orifice or a nozzle to provide a leakby line for pressure control in each channel. Such orifice/nozzle configuration reduces costs, material and space, which is desirable to purchasers and users of multiple zone pressure controllers. Employing orifice/nozzles alone however, would require extremely tight tolerances when machining the orifice/nozzles in order to match the existing needle valve set up of the current devices. This would add significant costs to the system, defeating the purpose of reducing costs by replacing each needle valve with a simpler device.

According to one aspect of the invention, the multiple zone pressure controller is arranged and configured to provide the substitution of the orifice/nozzles for the needle valves with permissible manufacturing tolerances when constructing and employing the orifice/nozzles as replacements for the corresponding needle valves.

In accordance with another aspect the system is constructed and arranged so as to sense any upstream pressure disturbances. This is preferably accomplished by employing a pressure transducer or sensor to monitor the upstream pressure. The pressure transducer provides information that can be used by the multiple zone pressure controller so as to provide pressure insensitive (PI) flow control. If there is an upstream pressure disturbance and a false flow signal in the sensor of the mass flow controller, the system will know it by virtue of the output of the upstream pressure transducer and cancel the false flow signal. The multiple zone pressure controller can also use the upstream pressure information to do a proactive control before the upstream pressure disturbance affects the downstream pressure control. Thus, the system and method described, provide better control performance, at reduced cost for manufacturers and customers alike.

Figure 2:
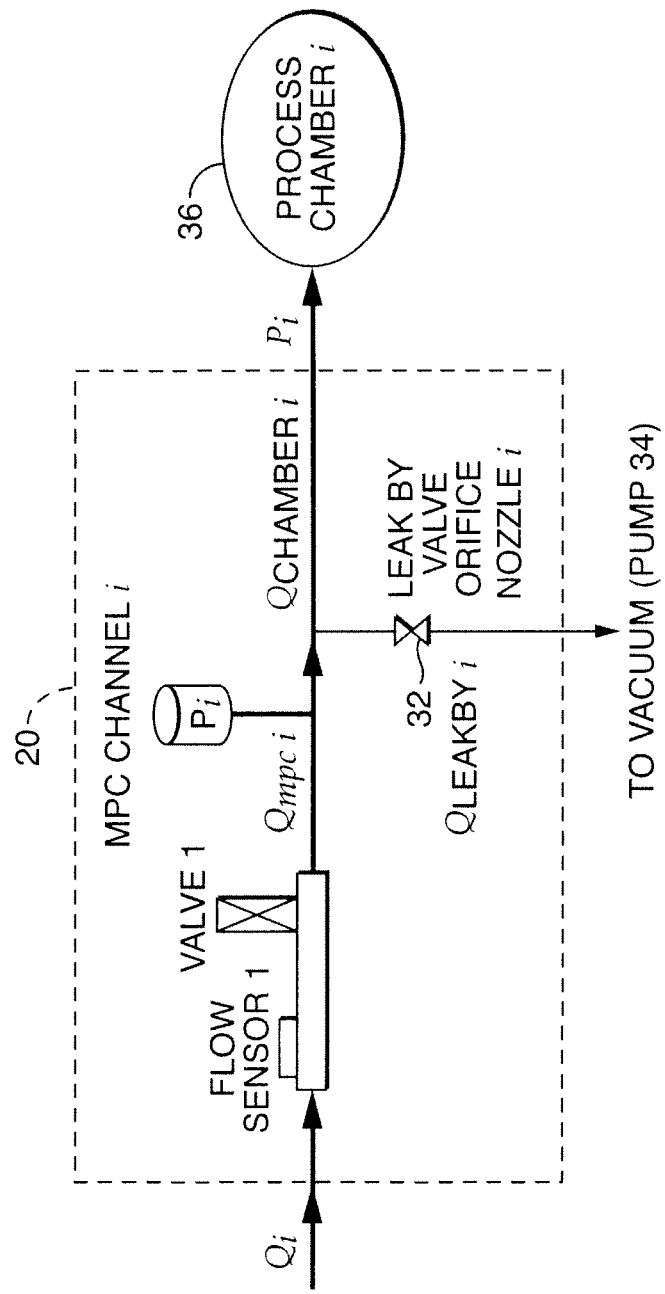
FIG. 2 is a partial schematic, partial block diagram of one channel of the multiple zone controller of FIG. 1.

Referring to FIGS. 1 and 2, one embodiment of the multiple zone pressure controller system 10 includes an inlet 12 receiving a gas or vapor from a gas source 14. The rate of flow into the system is indicated as Qt. An upstream pressure Pu 16 is connected to sense the pressure of the gas or vapor flowing into the system, and provide a signal to the controller 26 representative of the upstream pressure measurement. The system receives the flow from the inlet and divides the flow among a plurality of (two or more) channels 18a, 18b ... 18n. Each channel includes a mass flow controller (designated 20a, 20b ... 20n). Each mass flow controller 20 includes a mass flow sensor 22 and a control valve 24. The sensor 22 of each mass flow controller 20 is constructed and arranged to sense the flow rate of gas or vapor through the corresponding channel 18, and provide a signal representative of the sensed flow to the controller 26. Controller 26 is arranged and configured to receive and send data from and to a user through a user interface (UI). Each channel 18 is also provided with a pressure transducer (designated 28a, 28b ... 28n) for sensing the pressure in the corresponding channel. A signal is provided to the controller 26 representative of the pressure measured by each transducer 28.

As mentioned above, needle valves are expensive and take up significant space. Accordingly, it is desirable to replace each needle valve with an orifice/nozzle which is substantially cheaper, and takes up less space than the corresponding needle valve. But elimination of the needle valve eliminates the ability to tweak the individual channels in order to fine tune the system. This results in a high requirement that the orifices and the valves are identical in performance, within tight tolerances so that the flow through each channel is matched. Such tight tolerances drives up the costs, and results in the loss of savings that are gained from eliminating the needle valves.

In accordance with one aspect of the present invention, it has been determined that the true measurement of interest is the true flow of vapor or gas through each channel into the respective zone of the process tool, regardless of the flow through the "leakby" orifice/nozzle. In this way each channel can be provided with an orifice/nozzle 32a, 32b ... 32n for providing leakby from the corresponding channel, without concern of tight tolerances that otherwise would be required. The leakby lines including leakby orifice/nozzle 32 are all connected to a vacuum pump 34 for drawing gas or vapor from the channel for pressure control.

In this way, the pressure of the gas delivered to each zone of a process tool 36 will be precisely controlled. Each downstream transducer 28 provides a measurement of the pressure within a corresponding channel, and generates a signal as a function of the measured pressure to the controller 26. The controller 26 compares the measured pressure with that of a set point, and provides a signal to the control valve 24 associated with the channel to make any adjustments to the flow so the measured pressure and the set point remain the same.

In order to provide a true flow through each channel of the system 10 into the process tool 36, each channel includes a mass flow controller 20 for controlling the rate of flow through each corresponding channel. The raw flow sensor signal of sensor 20 of each mass flow controller 20 is typically used for process tool diagnosis. However, any upstream pressure disturbance will generate a false flow signal in the flow sensor, which causes a false alarm during the process tool diagnosis at least in some applications. Further, the raw flow sensor signal is not a good indicator of the leaking around the wafer in the chamber.

Accordingly, the controller 26 of the system 10 is configured and arranged to use data from each sensor 22, the upstream pressure transducer 16 and each downstream pressure transducer 28 to measure and control the true flow through each channel into the process tool 36, according to the following relationship:

$$Q_{chamber,i} = Q_{mpc,i} - Q_{leakby,i} - \frac{V_{d,i} \cdot T_{stp}}{T \cdot P_{stp}} \cdot \frac{dP_{d,i}}{dt} \tag{1}$$

wherein $Q_{chamber,i}$ is the net or the true flow rate into the process tool 36 for channel i, $Q_{mpc,i}$ is the flow rate measured by the flow sensor 22 of the mass flow controller 20. It can be further compensated by the upstream pressure transducer 16 in channel i such that it is a pressure insensitive flow rate;

$Q_{leakby,i}$ is calculated based on the properties of the orifice/nozzle 32 in channel i. In the FIG. 1 embodiment each nozzle/orifice 32 is constructed so that choke flow conditions exist through each nozzle/orifice—this can be either measured or calculated based on the properties of the nozzle/orifice); while the last term:

$$\frac{V_{d,i} \cdot T_{stp}}{T \cdot P_{stp}} \cdot \frac{dP_{d,i}}{dt} \tag{2}$$

is a function of the rate of change in downstream pressure, $P_{d,i}$, measured by the pressure transducer 28 of the channel i, the downstream volume, $V_{d,i}$, between the control valve 24 and the process tool 36 for channel i, the measured gas/vapor temperature, T. $T_{stp}$ is the standard temperature which is 273.15K, and $P_{stp}$ is the standard pressure which is 1.01325e5 Pa.

If a gas or vapor flowing through a channel is known, then the only variable in calculating $Q_{leakby,i}$ is the downstream pressure Pd, which can be measured with the downstream transducer 26. Then:

$$Q_{leakby,i} = C' \cdot A_i \cdot P_{d,i} \cdot f(\gamma, M, T) \tag{3}$$

wherein C' is the discharge coefficient for the orifice (typical values are from 0.7 to 1.0)

$A_i$ is the cross section size of the orifice;

$P_{d,i}$ is the downstream pressure measured with the transducer 28 in channel i, and $f(\gamma,M,T)$ is a gas function, which is a function of the specific heat ratio of the gas γ, the molecular weight M of the gas, and the temperature T of the gas.

Referring to FIG. 2, $Q_{chamber,i}$ indicates the true leaking around the wafer in the processing chamber in zone i. It is more accurate and meaningful than the previously used variable $Q_{mpcr,i}$, for process tool diagnosis. Acceptance of using $Q_{chamber,i}$ for diagnosing the leaking rate around the wafer will result in eliminating the need for tight tolerance requirements on the leak-by orifice/nozzle, thus reducing the costs of each orifice/nozzle. The result is that the system and method provide (a) good control performance for multiple zone pressure control applications, (b) pressure insensitive flow output information form the multiple zone pressure controller, and (c) true flow information to process tools, such as chambers, for process tool diagnosis, while eliminating the need for needle valves.

The result is a good solution for multiple zone pressure control applications, improving the control performance in response to upstream pressure disturbances, as well as providing true flow information to the process chambers for process tool diagnosis. By eliminating the needle valves, one reduces the tuning time required to provide consistent performance among different units.

Figure 3:
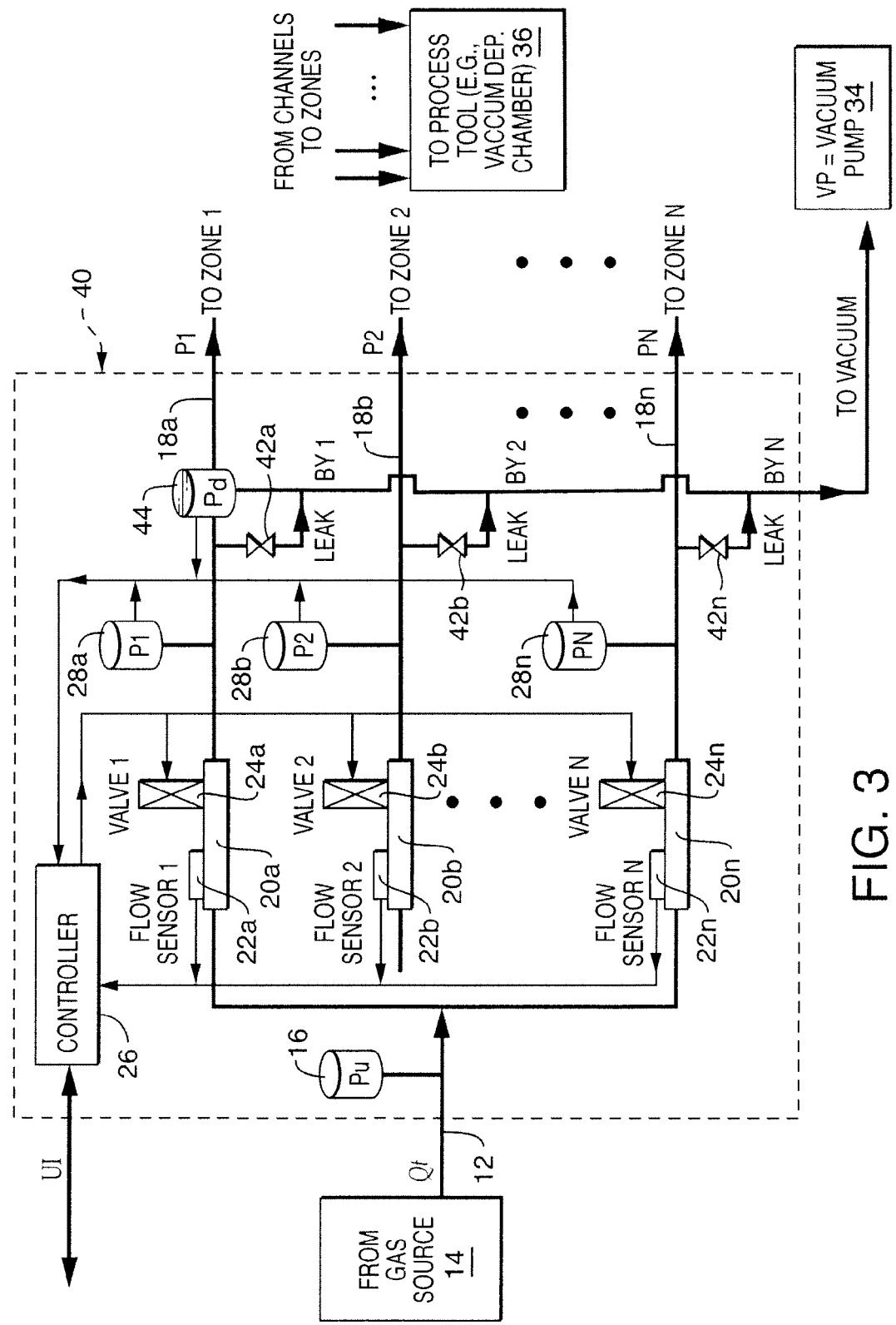
FIG. 3 is a partial schematic, partial block diagram of a second embodiment of a multiple zone controller for controlling the pressure of inlet flow of a gas or vapor into multiple zones of a vacuum deposition chamber.

As noted above, the embodiment shown in FIG. 1 requires that each nozzle/orifice 32 be constructed so that choke flow conditions exist through each nozzle/orifice—this can be either measured or calculated based on the properties of the nozzle/orifice. Referring to FIG. 3, the multiple zone pressure controller system 40, which can be constructed arranged so that each nozzle/orifice 42a, 42b . . . 42n can operate under both chock and non-choke flow conditions. Specifically, a pressure transducer 44 can be connected and arranged so as to measure the downstream pressure of the leakby line so that the leakby flow rate can be calculated even if the flow through the leakby orifice/nozzle is not choked. The leakby flow through each orifice/nozzle can be calculated by either one of two methods: (1) a mathematical formula or (2) a lookup table having the various values of $Q_{leakby,i}$, as function of the upstream pressure of the nozzle which is measured by the pressure transducer 28 and the downstream pressure of the nozzle which is measured by the downstream pressure transducer 44.

One skilled in the art will appreciate that embodiments of the present disclosure, including control algorithms/software/signals for controlling electrolysis, can be implemented in hardware, software, firmware, or any combinations of such, and over one or more networks.

While certain embodiments have been described herein, it will be understood by one skilled in the art that the methods, systems, and apparatus of the present disclosure may be embodied in other specific forms without departing from the spirit thereof. For example, the system and method described can be implemented for any number of channels of a multiple zone control system. Further, the controller 26 can be arranged to calculate $Q_{chamber,i}$ for each channel using the equation (1). Alternatively, a table can be generated using a calibration technique to provide various readings of flow rate vs. pressure.

Accordingly, the embodiments described herein, and as claimed in the attached claims, are to be considered in all respects as illustrative of the present disclosure and not restrictive.

What is claimed is:

1. A multiple zone pressure controller system for controlling the pressure of a gas or vapor flowing to at least two zones of a process tool, the system comprising:
at least two channels configured and arranged to provide the flow of the gas or vapor to corresponding zones of the process tool, each channel including:
a flow sensor configured and arranged to sense the flow of gas or vapor in the channel; and
a leak-by orifice or nozzle configured to provide a leak rate of gas or vapor from the channel;
a pressure transducer configured and arranged to measure the pressure of gas or vapor in the channel;
a valve configured and arranged to control the pressure of gas or vapor in the channel;

a controller configured and arranged to determine a true flow information to each zone of the process tool and a true leak rate away from a chamber of the process tool; and
a pressure transducer for measuring an upstream pressure of an inlet line so as to provide an upstream pressure signal to the controller, wherein the upstream pressure signal is used by the controller to provide a regulated constant downstream pressure that includes proactive control of downstream pressure for each channel to reduce disturbance in the downstream pressure otherwise cause by changes in upstream pressure.

2. The multiple zone pressure controller system according to claim 1 wherein each valve controls the pressure in its channel as a function of a set point and the sensed pressure in its channel.

3. The multiple zone pressure controller system according to claim 1, wherein the flow sensor in each channel is configured and arranged so as to provide a mass flow signal as a function of the flow through the associated channel, wherein the true flow information to each zone is a function of the corresponding mass flow signal.

4. The multiple zone pressure controller system according to claim 3, wherein the true flow information is a function of the flow through the corresponding leak-by orifice nozzle.

5. The multiple zone pressure controller according to claim 4, wherein the leak-by orifice nozzle is configured to operate under choke flow conditions.

6. The multiple zone pressure controller system according to claim 4, wherein the leak-by orifice or nozzle is configured to operate under choke flow and non-choke flow conditions.

7. The multiple zone pressure controller system according to claim 3, wherein the controller includes a calibration table of flow rate vs. pressure for each leak-by orifice or nozzle.

8. The multiple zone pressure controller system according to claim 3, wherein the controller calculates true flow information based upon the following relationship:

$$Q_{chamber,i} = Q_{mpc,i} - Q_{leakby,i} - \frac{V_{d,i} \cdot T_{stp}}{T \cdot P_{stp}} \cdot \frac{dP_{d,i}}{dt}$$

wherein $Q_{chamber,i}$ is the flow rate into the process tool for channel i,
$Q_{mpc,i}$ is the flow rate measured by the flow sensor in channel i;
$Q_{leakby,i}$ is calculated based on the properties of the orifice or nozzle in channel i. and $$\frac{V_{d,i} \cdot T_{stp}}{T \cdot P_{stp}} \cdot \frac{dP_{d,i}}{dt}$$

is a function of the rate of change in downstream pressure,
$P_{d,i}$, measured by the pressure transducer of the channel i, the downstream volume, $V_{d,i}$, between the control valve and the process tool for channel i, the measured gas/vapor temperature, T; $T_{stp}$ is the standard temperature which is 273.15K, and $P_{stp}$ is the standard pressure which is 1.01325e5 Pa.

9. The multiple zone pressure controller system according to claim 1, wherein the upstream pressure signal is used by the controller for compensating pressure disturbance on a raw flow sensor signal such that the flow sensor signal is pressure insensitive.

* * * * *